United States Patent [19]

Goto et al.

[11] E Patent Number: Re. 31,630

[45] Reissued Date of Patent: Jul. 17, 1984

[54] ELECTRON BEAM EXPOSURE SYSTEM

[75] Inventors: Eiichi Goto, Fujisawa; Takashi Souma, Kiyose; Masanori Idesawa, Wako; Kazumitsu Tanaka, Akishima, all of Japan

[73] Assignees: Rikagaku Kenkyusho, Saitamaken; Nihon Denshi Kabushiki Kaisha, Tokyo, both of Japan

[21] Appl. No.: 395,853

[22] Filed: Jul. 6, 1982

Related U.S. Patent Documents

Reissue of:

[64] Patent No.: 4,117,340
Issued: Sep. 26, 1978
Appl. No.: 801,812
Filed: May 31, 1977

[30] Foreign Application Priority Data

Jun. 11, 1976 [JP] Japan ..... 51-69103

[51] Int. Cl.[3] ..... H01J 37/00

[52] U.S. Cl. ..... 250/492.2; 250/400

[58] Field of Search ..... 250/492.2, 398, 400; 219/121 EB

[56] References Cited

U.S. PATENT DOCUMENTS

| | | | |
|---|---|---|---|
| 3,644,700 | 2/1972 | Kruppa | 250/492.2 |
| 3,922,546 | 11/1975 | Livesay | 250/492.2 |
| 4,017,403 | 4/1977 | Freeman | 250/492.2 |
| 4,112,305 | 9/1978 | Goto et al. | 250/492.2 |
| 4,145,597 | 3/1979 | Yasuda | 250/492.2 |
| 4,393,312 | 7/1983 | Collier et al. | 250/492.2 |

*Primary Examiner*—Bruce C. Anderson
*Attorney, Agent, or Firm*—Webb, Burden, Robinson & Webb

[57] ABSTRACT

An electron beam with a cross-section shaped by two aperture plates and a deflector sequentially irradiates pattern areas within a plurality of unit squares on a workpiece in the X and Y directions. The workpiece is continuously shifted in the Y direction by a mechanical means, the amount of workpiece shift being detected to control the deflector and the shaping of said beam cross-section.

6 Claims, 12 Drawing Figures

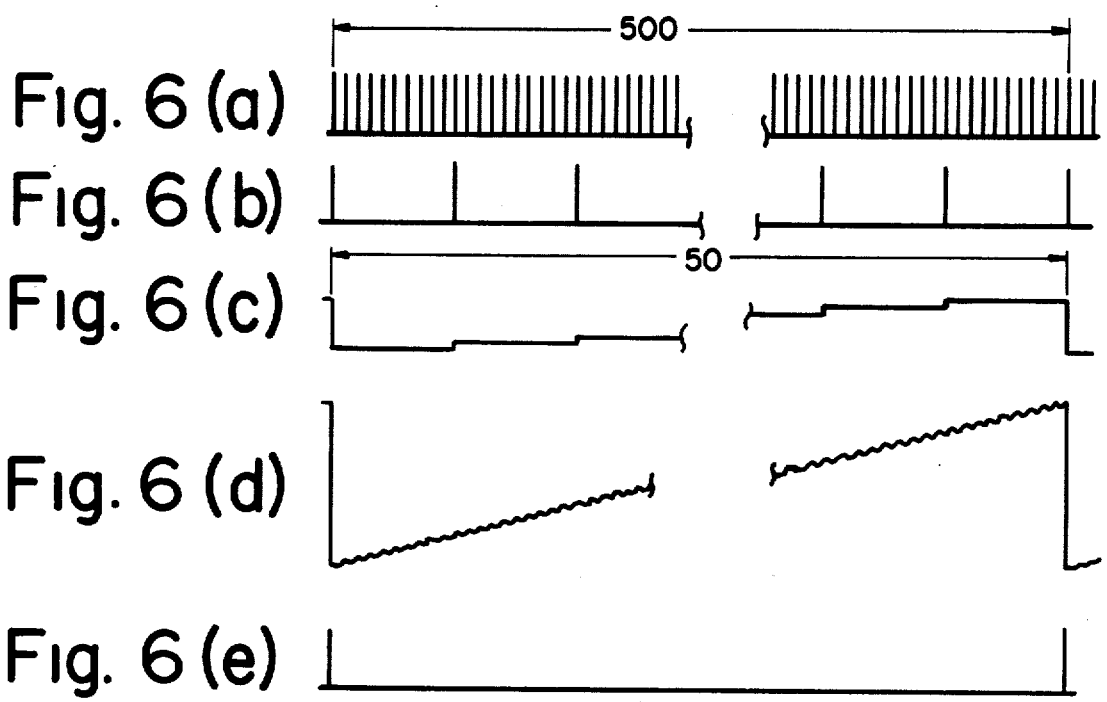
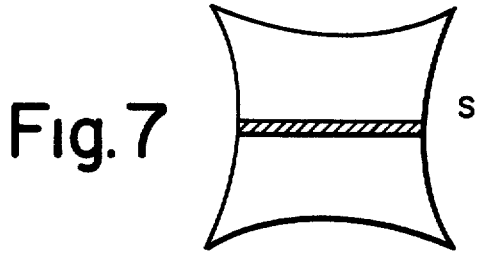
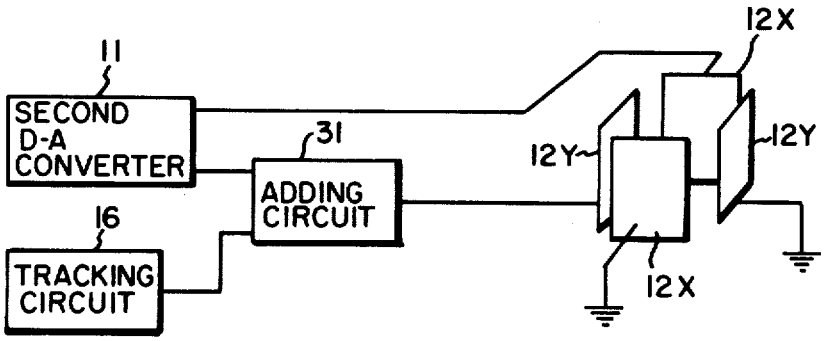
Fig. 8

ELECTRON BEAM EXPOSURE SYSTEM

Matter enclosed in heavy brackets [ ] appears in the original patent but forms no part of this reissue specification; matter printed in italics indicates the additions made by reissue.

This invention relates in general to an electron beam exposure system and in particular to a high precision, high speed exposure system.

Recently, an electron beam exposure system was proposed in which two aperture plates each having multi-sided holes are arranged above and below an electron beam deflector respectively. By so doing, an optionally shaped electron beam is formed and projected onto a workpiece or specimen. In this system, the cross-sectional shape and size of the projected electron beam can be optionally selected in accordance with the shape and size of the figure or pattern to be exposed. It is therefore possible, compared with the prior art in which the pattern is exposed (scanned) with a finely focused electron beam, to reduce the exposure time considerably. However, in the apparatus as thus proposed, the deflecting range of the electron beam; i.e., the exposed region or area, is limited to 1 mm~several mm, due to distortion of the electron optical system, etc. Therefore, in order to expose a workpiece requiring a large pattern exposure, the stage on which the workpiece is mounted must be moved stepwise after completing each partial pattern exposure. This, in turn, presents problems in that when the stage is started and stopped, it is subjected to an abrupt accelerating or decelerating force which presents mechanical problems, thus making it very difficult to shorten the periodicity of each step advance. Moreover, after the stage stops, it continues to vibrate for a while, during which time the exposure operation must be suspended. As a result, the exposure speed, although better than that of the prior art, is restricted to some extent. A further demerit of the stepwise movement is that it is difficult to accurately link up each square in the case of workpieces requiring a large range of exposure.

Accordingly, one object of this invention is to shorten the exposure time of large patterns.

Another object of this invention is to expose large patterns with high accuracy.

Yet another object of this invention is to precisely link up each partially exposed unit square.

These objects are achieved by using two aperture plates and a deflector for forming an arbitrary electron beam cross-section, a mechanism for continuously shifting the workpiece in the Y-direction, and a tracking (Y-direction) deflector for compensating said workpiece shift.

Figure 1:
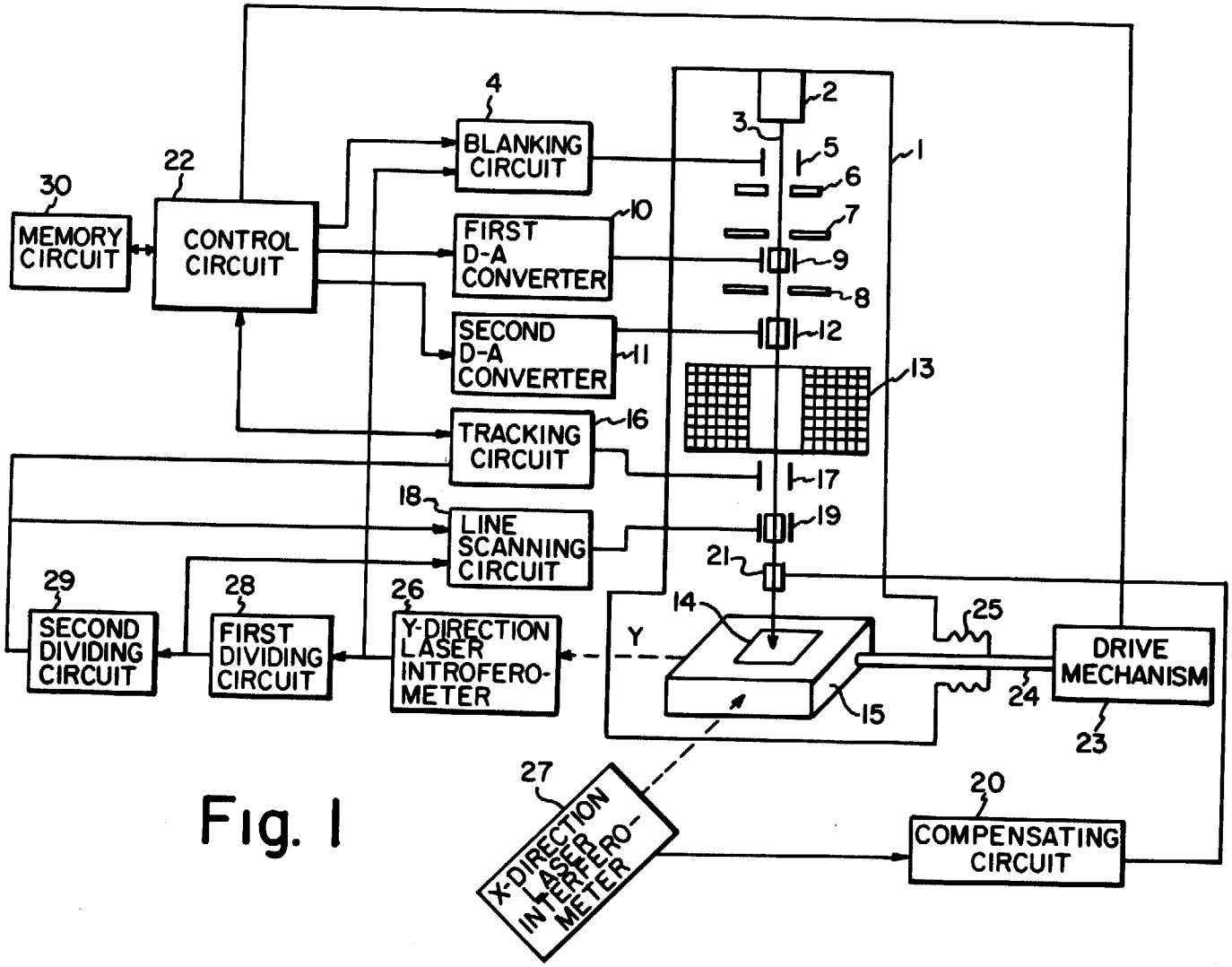
Figure 2:
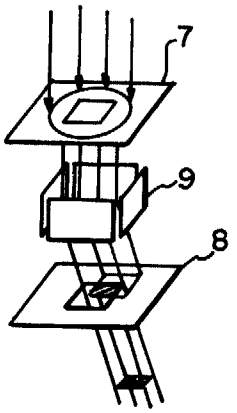

Other features and objects of the invention will become more readily apparent by reading through the following description in connection with the accompanying drawings of which, FIG. 1 is a schematic drawing showing one embodiment of this invention, FIG. 2 is a schematic drawing showing how the electron beam is formed.

FIGS. 3, 4, 5, 6 and 7 are schematic drawings for explaining the exposure method adopted in the embodiment shown in FIG. 1, and FIG. 8 is a schematic drawing showing the essential part of another embodiment of this invention.

In FIG. 1 showing one embodiment of this invention, a column 1 has an interior maintained under vacuum during operation. An electron gun 2 generates an electron beam 3. A blanking circuit 4 supplies a blanking signal to a blanking deflector (deflecting coils or plates) 5 so as to prevent the electron beam from passing through aperture 6. The cross-section of the electron beam passing through said aperture 6 is optionally shaped by aperture plates 7 and 8 provided with multi-sided holes, and a deflector 9 arranged there between as shown in FIG. 2. Additionally, in FIG. 2, it is desirable to incorporate an electron lens between said aperture plates so that the image of the aperture plate 7 is focused on the aperture plate 8. A (first) D-A converter 10 supplied a signal to the deflector 9, said signal serving to designate the cross-sectional shape of the electron beam. A second D-A converter 11 outputs a signal to a deflector 12 for small scale deflection of the electron beam, and projection lens 13 converges and projects the electron beam onto a workpiece 14 mounted on a stage 15. The position at which the electron beam irradiates the workpiece is also varied by signals from a tracking circuit 16 supplied to a Y-direction deflector 17, a line scanning circuit 18 supplied to a deflector 19 for large scale deflection of the electron beam, and a compensating circuit 20 supplied to an X-direction deflector 21, respectively. Moreover, the stage 15 on which the workpiece 14 is mounted, is continuously shifted at a more or less constant speed in the Y-direction by a control circuit 22 which controls a drive mechanism 23 and a drive shaft 24 linked to said stage 15. Bellows 25 enable the shaft to pass into column 1 while preserving the vacuum. The amount by which the stage 15 shifts is detected by a Y-direction laser interferometer 26 and an X-direction laser interferometer 27, the detected output signal from interferometer 27 being supplied to the compensating circuit Furthermore, each time the stage is shifted by a certain amount, the Y-direction laser interferometer 26 generates a clock pulse signal which is fed into a first dividing circuit 28. The output from said first dividing circuit 28 is, in turn, simultaneously fed into a second dividing circuit 29 and the scanning circuit 18. The output of the second dividing circuit 29 is applied to both the tracking circuit 16 and the scanning circuit 18. Meanwhile, a memory circuit 30 sends a signal containing data appertaining to the pattern intended for exposure, to the control circuit 22 which, in turn, sends the information to the blanking circuit 4 and D-A converters 10 and 11.

Figure 3:
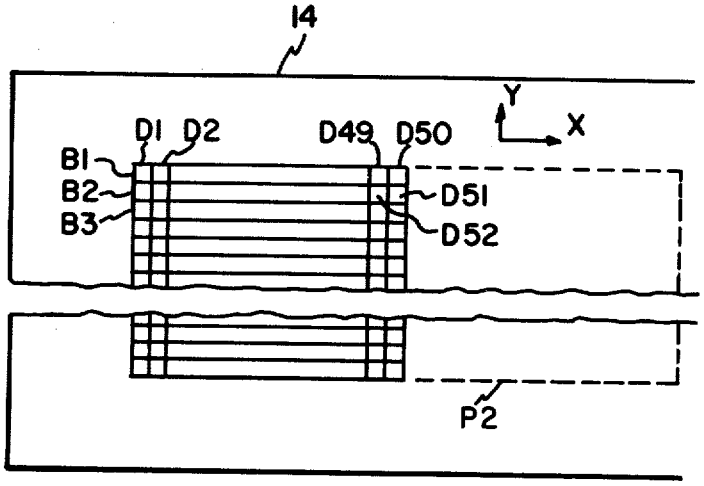
Figure 4:
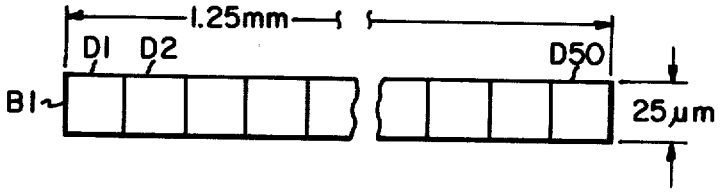
Figure 5:
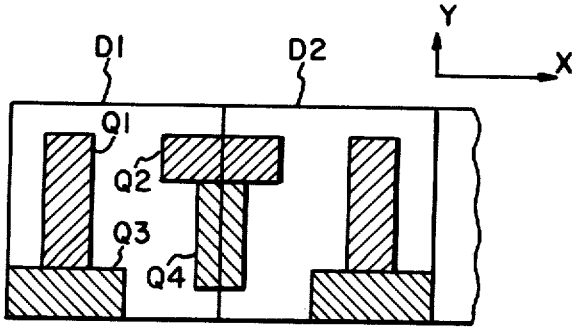

In the above described configuration, the aperture holes of the plates 7 and 8 are square (250 $\mu m \times 250$ $\mu m$), as shown in FIG. 2, and the reduction rate of the projector lens 13 is 1/10. Accordingly, the maximum size of the electron beam cross-section projected onto the surface of the workpiece measures 25 $\mu m \times 25$ $\mu m$. Utilizing this maximum size (viz. 25 $\mu m \times 25$ $\mu m$) of the electron beam cross-section as a "unit square", the surface of the workpiece 14 intended for large pattern exposure is thus hypothetically divided into many "unit squares" D1, D2, D3, . . . D50, . . . as shown in FIGS. 4 and 5 which are enlargements of FIG. 3. The hatched areas Q1, Q2, Q3, Q4, . . . in FIG. 5, represent pattern elements within "unit squares" D1 and D2. Each one of these pattern elements is rectangular and can be exposed by a single step scan (projection) of the electron beam having an appropriate cross-sectional shape, as determined by the output signal of the control circuit 22 in conjunction with the first D-A converter 10 and the deflector 9. The memory circut 30 prestores the information data pertaining to the position and shape of each "pattern element ", so as to memorize a large pattern intended for exposure on the workpiece. Further, the line scanning circuit 18 supplies a signal to deflector 19, in stepwise fashion, in order to shift the electron beam in the amount of said "unit square" in the X-direction, as per the output of the second dividing circuit 29. Moreover, by shifting the workpiece at a constant speed in the Y-direction through the medium of the drive mechanism 23, a large area, in which any desired pattern is can be exposed, is fully covered by many "unit square".

OPERATION

The drive mechanism 23 shifts the stage 15 in the Y-direction at a fixed speed of 5 mm/sec through the medium of a start signal from the control circuit 22. At each 0.05 μm shift of the stage, the Y-direction laser interferometer 26 generates a clock pulse as shown in FIG. 6(a). That is to say, said interferometer generates 100,000 clock pulses/sec. The clock pulses, thus generated, are supplied to the blanking circuit 4, thereby controlling the electron beam. In other words, the electron beam irradiation on the workpiece 14 is synchronized with said clock pulses. The control circuit 22 then reads out said information in sequence (Q1~Q2~Q3~Q4) and sends signals designating the shape and size of each pattern element to deflector 9 and sends signals designating the position of each pattern element to deflector 12. Accordingly, when four clock pulses are supplied to the control circuit 22, four pattern elements (viz., Q1, Q2, Q3, Q4) are described on the workpiece in the first unit square D1, thus completing exposure of the first unit square. The electron beam is then shifted (as shown in FIG. 6(c)), in stepwise fashion in the X-direction, to the next unit square D2 by the deflector 19 which receives a scanning signal from the scanning circuit 18, and the exposure process is repeated.

In this way, the pattern elements described in each unit square are successively exposed. The scanning signals from the scannning circuit 18 are synchronized with the shift pulses as shown in FIG. 6(b) which are, in turn, obtained by reducing the number of clock pulses to 1/10 by means of the first dividing circuit 28. Accordingly, in any one unit square, it is possible to expose up to ten assorted pattern elements. Thus, in the case of D1 where only four pattern elements have been described, since four clock pulses are sufficient to complete the exposure, the control circuit 22 dispatches a command signal to the blanking circuit 4 which in turn sends a blanking signal to the deflector 5 during the period in which the remaining six clock pulses are generated.

A factor of consideration here, however, is that one clock pulse shifts the workpiece 0.05 μm in the Y-direction. For example, in the case of D1, the position of the initial pattern Q1 is correct so that when Q2 is described, the workpiece shifts 0.05 μm in the Y-direction; further when Q3 and Q4 are described, the workpiece shifts 0.1 μm and 0.15 μm respectively. Thus, in this embodiment, by shifting the electron beam in the amount of 0.05 μm on the workpiece along the Y-axis for each clock pule generated, the position of the pattern element in said direction is always exact, due to the fact that a tracking signal from the tracking circuit 16 (which changes stepwise, as shown in FIG. 6(d)) is sent to the Y-direction deflection coil 17.

The stage, in addition to being shifted in the Y-direction, can also be shifted in the X-direction. For example, in the case of zigzag mvement, the next pattern element on the workpiece produces a positional shift in the X-direction is detected by the laser interferometer 27 whose output signal is applied to the compensating circuit 20 which sends a signal to the X-direction deflector 21 so as to compensate the mechanical shift error generated at said shift. Additionally, the interferometer 27, the compensating circuit 20 and the deflector 21 are also used in order to cancel out the mechanical shift in X-direction during the continuous mechanical shift in Y-direction. By so doing, successive square units are exposed in the X-direction. When a band B1 of 50 unit squares measuring 25 μm×1.25 mm is exposed (see FIG. 4), the number of shift pulses (FIG. 6(b)) is reduced to 1/50 by means of the second dividing circuit 29 and a reset pulse (FIG. 6(e)) is generated which resets the scanning circuit 18 and the tracking circuit 16. However, it is also possible to achieve the same exposure by using the output signal from the second dividing circuit 29 as an inverse (zigzag) scanning deflection signal instead of as the reset signal. In this case, unit square D51, D52, . . . are positioned as shown in FIG. 3. Consequently, at the time when the B1 band exposure is completed, the workpiece 14 is shifted by 25 μm in the Y-direction from the position it was at the beginning of the B1 band exposure, and the next exposure band B2 is precisely linked thereto. By so doing, many exposure bands B1, B2, B3 . . . having a width of 25 μm and a length of 1.25 mm are successively linked until finally the entire pattern having a width of 1.25 mm and a length of several mm is exposed.

Additionally, in order to expose a pattern having a width larger than 1.25 mm, an X-direction drive mechanism (not shown in FIG. 1) is used so as to stepwise shift the workpiece 1.25 mm per step. In this case, the above mentioned exposure process is repeated in the area enclosed by the broken line P2 in FIG. 3.

The exposure area on the workpiece due to large area deflection of the conventional system is shown in FIG. 7. In the figure, the hatched area S shows the area actually deflected by the deflector 19 in the FIG. 1 embodiment. And distortion influence of the above one-dimensional deflection is less than that of the two-dimensional deflection.

In the FIG. 1 embodiment, large distortion influence due to large deflection is not avoided by using only a one-dimensional large deflection. However, if a multi-stage deflector is used instead of a single stage deflector 19, it is possible to reduce the deflection distortion by maintaining the irradiating angle of the electron beam at 90°.

Additionally, it is possible to dispense with the deflector 17 in the embodiment according to FIG. 1, by constructing the deflecting means as shown in FIG. 8. In FIG. 8, an adding circuit 31 is incorporated between the second D-A converter 11 and the Y-direction deflecting plate 12Y forming part of the deflector 12 and the output signal of the tracking circuit 16 is added to said adding circuit 31.

As mentioned above, since, in the subject embodiment, drive mechanism 23 shifts the workpiece at a constant speed, the exposure speed and the endurance of said drive mechanism are better than in the case of the prior art. Further, since the electron beam deflection is controlled by clock pulses representing the amount of workpiece shift, the positional accuracy of the exposed pattern is greatly improved regardless of the change in the shifting speed of the workpiece.

Having thus described my invention with the detail and particularity required by the Patent Laws, what is desired protected by Letters Patent is set forth in the following claims.

We claim:

[1. An electron beam exposure system comprising a source for emitting an electron beam; means comprising two aperture plates having multi-sided openings and an electron beam lens and a first deflecting means located between said two aperture plates, said electron beam lens serving to focus the image of the first aperture plate on the second aperture plate, said first deflecting means serving to vary the shape and size of said electron beam cross-section through the combined interceptive action of said two aperture plates; an electron optical system for converging and projecting the electron beam thus shaped onto a workpiece; a driving means for shifting the workpiece continuously in a selected direction; and a second deflecting means for deflecting the electron beam in a narrow band range on the workpiece more or less perpendicular to said selected direction.]

2. An electron beam exposure system comprising a source for emitting an electron beam; means comprising two aperture plates having multi-sided openings and an electron beam lens and a first deflecting means located between said two aperture plates, said electron beam lens serving to focus the image of the first aperture plate on the second aperture plate, said first deflecting means serving to vary the shape and size of said electron beam cross-section through the combined interceptive action of said two aperture plates; an electron optical system for converging and projecting the electron beam thus shaped onto a workpiece *to expose a two-dimensional pattern element thereon;* a driving means for shifting the workpiece continuously in a selected direction; a second deflecting means for *stepwise* deflecting the electron beam in a narrow band range on the workpiece more or less perpendicular to said selected direction; and means for generating a signal *comprising a pulse* each time the workpiece shifts by a certain constant amount in the selected direction, [said signal being used as a synchronizing signal for controlling the first deflecting means comprising part of said beam shaping means] *a dividing circuit frequency for dividing the said pulse signal, the output of the dividing signal being used to directly and periodically initiate the instances when the second deflecting means produces a stepwise deflection.*

3. An electron beam exposure system according to claim 2 in which said signal generating means incorporates a laser interferometer.

4. An electron beam exposure system comprising a source for emitting an electron beam; means comprising two aperture plates having multi-sided openings and an electron beam lens and a first deflecting means located between said two aperture plates, said electron beam lens serving to focus the image of the first aperture plate on the second aperture plate, said first deflecting means serving to vary the shape and size of said electron beam cross-section through the combined interceptive action of said two aperture plates; an electron optical system for converging and projecting the electron beam thus shaped onto a workpiece *to expose a two-dimensional pattern element thereon*; blanking means for interrupting the electron beam projected on the workpiece; a driving means for shifting the workpiece continuously in a selected direction; a second deflecting means for *stepwise* deflecting the electron beam in a narrow band range on the workpiece more or less perpendicular to said selected direction; and means for generating a signal *comprising a pulse* each time the workpiece shifts by a certain constant amount in the selected direction, [said signal being used a synchronizing signal for controlling said blanking means] *a dividing circuit for frequency dividing the said pulse signal, the output of the dividing circuit being used to directly and periodically initiate the instances when the blanking means interrupts the electron beam.*

5. An electron beam exposure system comprising a source for emitting an electron beam; means comprising two aperture plates having multi-sided openings and an electron beam lens and a first deflecting means located between said two aperture plates, said electron beam lens serving to focus the image of the first aperature plate on the second aperature plate, said first deflecting means serving to vary the shape and size of said electron beam cross-section through the combined interceptive action of said two aperture plates; an electron optical system for converging and projecting the electron beam thus shaped onto a workpiece *to expose a two-dimensional pattern element thereon*; a driving means for shifting the workpiece continuously in a selected Y-direction; a second deflecting means for large step shifting the electron beam in the X-direction perpendicular to said Y-direction; a third deflecting means for small scale *stepwise* varying of the electron beam over an area on the workpiece generally defined by the drive means and second deflecting means; and a means for generating a signal *comprising a pulse* each time the workpiece shifts by a certain constant amount in the selected Y-direction, [said signal being used as a synchronizing signal for controlling said second and/or third deflecting means] *a dividing circuit for frequency dividing the said signal, the output of the dividing circuit being used to directly and periodically initiate the instances when the second and/or third deflecting means produce stepwise deflection.*

6. An electron beam exposure system according to claim 5 in which said signal generating means incorporates a laser interferometer and a circuit for dividing the output pulses of said interferometer.

[7. An electron beam exposure system comprising a source for emitting an electron beam; means comprising two aperture plates having multi-sided openings and an electron beam lens and a first deflecting means located between said two aperture plates, said electron beam lens serving to focus the image of the first aperture plate on the second aperture plate, said first deflecting means serving to vary the shape and size of said electron beam cross-section through the combined interceptive action of said two aperture plates; an electron optical system for converging and projecting the electron beam thus shaped onto a workpiece; a driving means for shifting the workpiece continuously in a selected direction; a second deflecting means for deflecting the electron beam in a narrow band range on the workpiece more or less perpendicular to said selected direction; means for generating a signal each time the workpiece shifts by some constant amount in the selected direction, and a third deflecting means for tracking the electron beam by some constant amount in said selected direction in response to said signal.]

[8. An electron beam exposure system according to claim 7 in which the deflecting signal of said third deflecting means is applied to the same deflecting plates or deflecting coils forming part of said second deflecting means for deflecting the electron beam in the narrow band on the workpiece via an adding circuit applied with other deflecting signals.]

9. An electron beam exposure system comprising a source for emitting an electron beam; means comprising two aperture plates having multi-sided openings and an electron beam lens and a first deflecting means located between said two plates, said electron beam lens serving to focus the image of the first aperture plate on the second aperture plate, said first deflecting means serving to vary the shape and size of said electron beam cross-section through the combined interceptive action of said two aperture plates; an electron optical system for converging and projecting the electron beam thus shaped onto a workpiece *to expose a two-dimensional pattern element thereon*; a driving means for shifting the workpiece continuously in a Y-direction; a second deflecting means for large step shifting the electron beam in the X-direction perpendicular to said Y-direction; a third deflecting means for small scale *stepwise* varying of the electron beam over an area on the workpiece generally defined by the drive means and second deflecting means; blanking means for interrupting the electron beam projected on the workpiece; a fourth deflecting means for tracking the electron beam by some constant amount in said Y-direction, and means for generating a signal *comprising a pulse* each time the workpiece shifts by a certain constant amount in the Y-direction, said signal being used as a synchronizing signal for controlling the [first, second, third and] fourth deflecting means [and the blanking means] *a dividing circuit for frequency dividing the said pulse signal, the output of the dividing circuit being used to directly and periodically initiate the stepwise deflection of the second, third and fourth deflecting means, and to directly and periodically initiate the instances of electron beam interruption by the blanking means.*

* * * * *

UNITED STATES PATENT AND TRADEMARK OFFICE

CERTIFICATE OF CORRECTION

PATENT NO. : Re. 31,630

DATED : July 17, 1984

INVENTOR(S) : Eiichi Goto et al.

It is certified that error appears in the above-identified patent and that said Letters Patent is hereby corrected as shown below:

Column 5 - Claim 2 Line 48 "frequency for" should read —for frequency—.

Column 6 - Claim 5 Line 19 "aperature" should read —aperture—.

Column 6 - Claim 5 Line 20 "aperature" should read —aperture—.

Column 7 - Claim 9 Line 12 After "two" insert —aperture—.

Signed and Sealed this

*Eighteenth* Day of *December 1984*

[SEAL]

*Attest:*

*Attesting Officer*

GERALD J. MOSSINGHOFF

*Commissioner of Patents and Trademarks*